(12) United States Patent
Lee et al.

(10) Patent No.: US 8,294,358 B2
(45) Date of Patent: Oct. 23, 2012

(54) ORGANIC LIGHT EMITTING DIODE DISPLAY DEVICE AND METHOD OF FABRICATING THE SAME

(75) Inventors: Sang-Bong Lee, Suwon-si (KR); Sok-Won Noh, Suwon-si (KR); Jin-Wook Seong, Suwon-si (KR); Mu-Hyun Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 236 days.

(21) Appl. No.: 11/958,562

(22) Filed: Dec. 18, 2007

(65) Prior Publication Data
US 2008/0143252 A1    Jun. 19, 2008

(30) Foreign Application Priority Data

Dec. 18, 2006 (KR) .................. 10-2006-0129627

(51) Int. Cl.
*H01J 1/62* (2006.01)
*H01J 63/04* (2006.01)

(52) U.S. Cl. ........ 313/504; 313/498; 313/503; 313/506; 313/512

(58) Field of Classification Search .......... 313/498–512; 428/690
See application file for complete search history.

(56) References Cited

U.S. PATENT DOCUMENTS

| 2005/0221121 | A1* | 10/2005 | Ishihara et al. ............... | 428/690 |
| 2006/0081840 | A1* | 4/2006 | Mori et al. ...................... | 257/40 |
| 2006/0159955 | A1* | 7/2006 | Inoue et al. .................... | 428/690 |
| 2006/0186791 | A1* | 8/2006 | Yoshitake et al. ............. | 313/503 |
| 2006/0240278 | A1* | 10/2006 | Hatwar et al. ................. | 428/690 |
| 2006/0240280 | A1* | 10/2006 | Liao et al. ...................... | 428/690 |
| 2006/0240281 | A1* | 10/2006 | Liao et al. ...................... | 428/690 |
| 2006/0251922 | A1* | 11/2006 | Liao et al. ...................... | 428/690 |

FOREIGN PATENT DOCUMENTS

| JP | 2000-235893 | 8/2000 |
| JP | 2002-35893 | 2/2002 |

(Continued)

OTHER PUBLICATIONS

Notice of Allowance issued on Apr. 28, 2008 in Korean Patent Application No. 2006-129627.

(Continued)

*Primary Examiner* — Anh Mai
*Assistant Examiner* — Kevin Quarterman
(74) *Attorney, Agent, or Firm* — Robert E. Bushnell, Esq.

(57) ABSTRACT

An organic lighting emitting diode display device (OLED display device) and a method of fabricating the same. The OLED display device includes: a substrate; a first electrode disposed on the substrate; an emission layer disposed on the first electrode; a second electrode disposed on the emission layer; and a hole injection layer disposed between the first electrode and the emission layer or between the emission layer and the second electrode, and formed of an inorganic semiconductor material, which evaporates at a temperature of 1100° C. or less. The method includes forming the hole injection layer between the first electrode and the second electrode, by thermally evaporating the inorganic semiconductor material, at a temperature of 1100° C., or less.

12 Claims, 3 Drawing Sheets

FOREIGN PATENT DOCUMENTS

| | | |
|---|---|---|
| JP | 2002-208483 | 7/2002 |
| JP | 2005-310401 | 11/2005 |
| KR | 2001-31006 | 4/2001 |
| KR | 10-385316 | 5/2003 |
| KR | 2004-73995 | 8/2004 |
| KR | 2005-15902 | 2/2005 |
| KR | 2005-28044 | 3/2005 |
| KR | 2006-110323 | 10/2006 |

OTHER PUBLICATIONS

Office Action issued on Oct. 31, 2007 by the Korean Intellectual Property Office for Korean Patent Application No. 2006-129627.
English Abstract for Korean Patent No. 2006-110323, (Oct. 2006).
English Abstract for Korean Patent No. 2005-28044, (Mar. 2005).
English Abstract for Korean Patent No. 2001-31006, (Apr. 2001).
English Abstract for Korean Patent No. 10-385316, (May 2003).

* cited by examiner

ORGANIC LIGHT EMITTING DIODE DISPLAY DEVICE AND METHOD OF FABRICATING THE SAME

CROSS-REFERENCE TO RELATED APPLICATION

This application claims the benefit of Korean Application No. 2006-129627, filed Dec. 18, 2006, in the Korean Intellectual Property Office, the disclosure of which is hereby incorporated herein by reference.

BACKGROUND OF THE INVENTION

1. Field of the Invention

Aspects of the present invention relate to an organic lighting emitting diode display device (OLED display device) and a method of fabricating the same, and more particularly, to an OLED display device including a hole injection layer, formed by thermal evaporation using an inorganic semiconductor material, which can be thermally evaporated, and a method of fabricating the same.

2. Description of the Related Art

An OLED display device comprises a substrate, an anode disposed on the substrate, an emission layer disposed on the anode, and a cathode dispose on the emission layer. In such an OLED display device, when a voltage is applied between the anode and the cathode, a hole (positively charged particle) and an electron are injected into the emission layer, and then recombined to create an exciton, which transitions from an excited state to a ground state, to thereby emit light.

The OLED display device may comprise at least one selected from the group consisting of a hole injection layer, a hole transport layer, an electron transport layer, and an electron injection layer. The hole injection layer can be disposed between the anode and the emission layer to effectively inject the hole from the anode into the emission layer. In a conventional OLED display device, these layers are organic thin films formed of an organic material. However, especially, the hole injection layer formed of an organic material has some problems, for example, poor interface characteristics with an anode formed of a transparent conductive material, such as, indium tin oxide (ITO) or indium zinc oxide (IZO), and damage occurring when the anode is formed by sputtering. Moreover, the hole injection layer cannot completely protect the underlying emission layer from the damage.

SUMMARY OF THE INVENTION

Aspects of the present invention provide an organic lighting emitting diode display device (OLED display device), in which interface characteristics between an anode and a hole injection layer are improved. The display device is driven with a lower driving voltage, and has an improved life span. Aspects of the present invention relate to a method of fabricating the display device.

According to an aspect of the present invention, an OLED display device comprises: a substrate; a first electrode disposed on the substrate; an emission layer disposed on the first electrode; a second electrode disposed on the emission layer; and a hole injection layer disposed between the first electrode and the emission layer, or between the emission layer and the second electrode. The hole injection layer is formed of an inorganic semiconductor material, which evaporates at a temperature of 1100° C., or less.

According to another aspect of the present invention, a method of fabricating an OLED comprises: preparing a substrate; forming a first electrode on the substrate; forming an emission layer on the first electrode; forming a second electrode on the emission layer; and forming a hole injection layer of an inorganic semiconductor material, which evaporates at a temperature of 1100° C. or less, between the first electrode and the emission layer, or between the emission layer and the second electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent, and more readily appreciated, from the following description of the embodiments, taken in conjunction with the accompanying drawings of which.

DETAILED DESCRIPTION OF THE EMBODIMENTS

Figure 1:
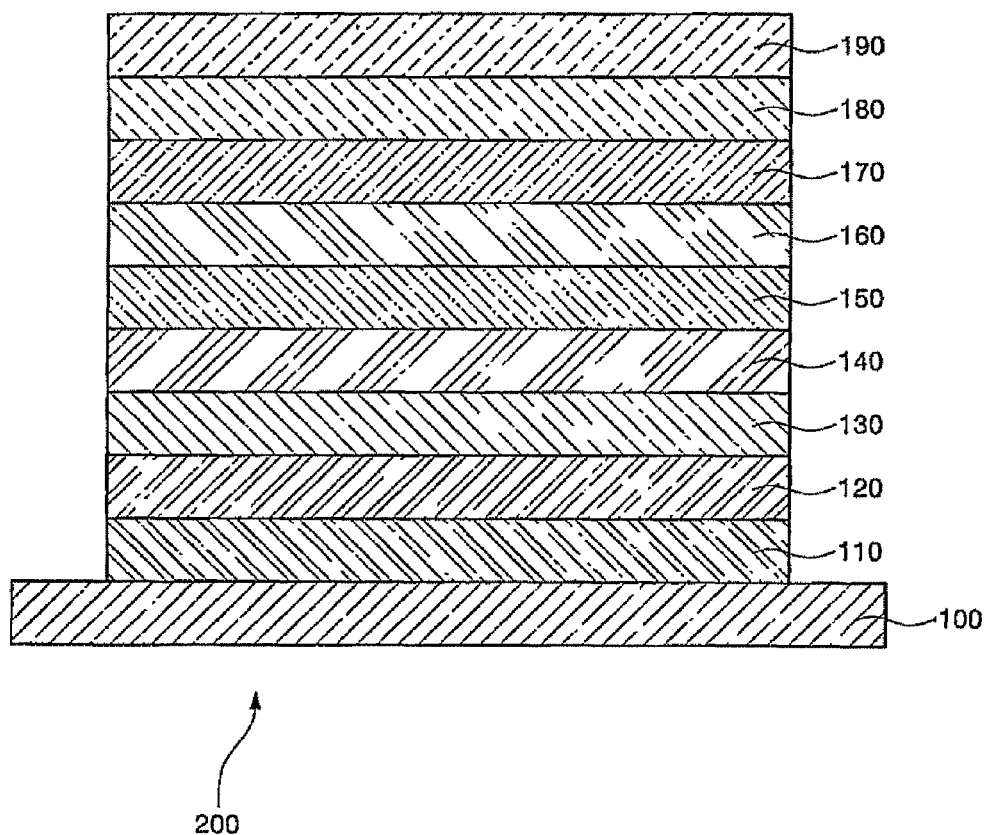
FIG. 1 is a cross-sectional view of an organic lighting emitting diode display device (OLED display device) including a hole injection layer, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the present invention, by referring to the figures. As referred to herein, when a first element is said to be "disposed" on a second element, the first element can directly contact the second element, or one or more other elements can be located therebetween.

FIG. 1 is a cross-sectional view of an organic lighting emitting diode display device (OLED display device) 200, according to an exemplary embodiment of the present invention. Referring to FIG. 1, a first electrode 110 is formed on a substrate 100. The substrate can be formed of, for example, glass, stainless steel, plastic, or the like. The substrate 100 may include at least one thin film transistor (not illustrated), which is in contact with the first electrode 110.

The first electrode 110 may be formed of magnesium (Mg), calcium (Ca), aluminum (Al), silver (Ag), barium (Ba), or an alloy thereof. The first electrode 110 may be a transparent or reflective electrode. The transparent electrode is thinly formed to permit light transmission there through, while the reflective electrode is thickly formed to reflect light. The first electrode 110 may act as a cathode. The first electrode 110 may be formed by, for example, sputtering, vapor phase deposition, ion beam deposition, electron beam deposition, or laser ablation.

The OLED display device 200 can include an electron injection layer 120, an electron transport layer 130, and/or a hole blocking layer 140, disposed on the first electrode 110. The electron injection layer 120 serves to facilitate electron injection into an emission layer. The electron injection layer 120 may be formed of, for example, tris(8-quinolinolate) aluminum (Alq3), lithium fluoride (LiF), a gallium (Ga) complex, or 2-(4-biphenyl)-5-(4-tert-butylphenyl)-1,3,4-oxadiazole (PBD). The electron transport layer 130 serves to facilitate electron transport into the emission layer 150. The electron transport layer 130 may be formed of a polymer such as PBD, 3-(4-tert-butylphenyl)-4-phenyl-5-(4-biphenyl)-1,2,4-triazole (TAZ) or spiro-PBD, or a low molecular weight material, such as, Alq3, BAlq or SAlq. The hole blocking layer 140 may be omitted when the emission layer is a fluorescent emission layer. The hole blocking layer 140 serves to prevent the diffusion of excitons generated from the emission layer, when driving an OLED. The hole blocking layer 140 may be formed of, for example, bis(2-methyl-8-quinolinolate)-(4-hydroxy-biphenyl)-aluminum (BAlq), bathocuproin (BCP), CF-X, TAZ, or spiro-TAZ. The electron injection layer 120, the electron transport layer 130, or the hole blocking layer 140 may be formed by, for example, deposition, spin coating, inkjet printing, or laser induced thermal imaging.

The emission layer 150 is disposed on the hole blocking layer 140. The emission layer 150 may be a phosphorescent or fluorescent emission layer. When the emission layer 150 is a fluorescent emission layer, the emission layer 150 may include one selected from the group consisting of distyrylarylene (DSA), a distyrylarylene derivative, distyrylbenzene (DSB), a distyrylbenzene derivative, 4,4'-bis(2,2'-diphenylvinyl)-1,1'-biphenyl (DPVBi), a DPVBi derivative, spiro-DPVBi, and spiro-sixphenyl (spiro-6P). The emission layer 150 may include a dopant material selected from the group consisting of styrylamine-based, perylene-based, and distyrylbiphenyl-based materials.

Alternatively, when the emission layer 150 is a phosphorescent emission layer, the emission layer 150 may include one selected from the group consisting of an arylamine-based, an carbazole-based and a spiro-based material, as a host material. The host material can include one selected from the group consisting of 4,4-N,N-dicarbazole-biphenyl (CBP), a CBP derivative, N,N-dicarbazolyl-3,5-benzene (mCP), an mCP derivative, and a spiro derivative. The emission layer 150 may include, as a dopant, a phosphorescent organic metal complex having one central metal selected from the group consisting of iridium (Ir), platinum (Pt), terbium (Tb), and europium (Eu). In addition, the phosphorescent organic metal complex may be one selected from the group consisting of PQIr, PQIr(acac), PQ2Ir(acac), PIQIr (acac), and PtOEP.

If the OLED display device 200 is a full color device, the emission layer 150 may be formed by deposition, inkjet printing, or laser induced thermal imaging.

The OLED display device 200 can include an electron blocking layer 160 and a hole transport layer 170, disposed on the emission layer 150. The electron blocking layer 160 serves to prevent the diffusion of excitons, generated from the emission layer 150 while driving the OLED display device 200. The electron blocking layer 160 may be formed of BAlq, BCP, CF-X, TAZ, or spiro-TAZ, for example. The hole transport layer 170 serves to facilitate hole transport to the emission layer 150, and may be formed of a low molecular weight material, such as, N,N'-bis(naphthalene-1-yl)-N,N'-bis(phenyl)benzidine (α-NPB), N,N'-bis-(3-methylphenyl)-N,N'-bis-(phenyl)-benzidine (TPD), s-TAD and 4,4',4"-tris(N-3-methylphenyl-N-phenyl-amino)-triphenylamine (MTDATA), or a polymer, such as PVK. Meanwhile, the electron blocking layer 160 and/or the hole transport layer 170, may be formed by deposition, spin coating, inkjet printing, or laser induced thermal imaging, for example.

The OLED display device 200 can include a hole injection layer 180 disposed on the hole transport layer 170. The hole injection layer 180 can be formed of an inorganic semiconductor material, which can evaporate at a temperature of 1100° C., or less. The inorganic semiconductor material is an inorganic material with semiconductor properties. The OLED display device 200 can include a second electrode 190 as a hole injection electrode, disposed on the hole injection layer 180. The second electrode 190 can be formed of a transparent electrode material, such as, indium tin oxide (ITO), indium zinc oxide (IZO), or zinc oxide (ZnO). The hole injection layer 180, formed of the inorganic semiconductor material, and the second electrode 190, formed of the transparent electrode material, which is an inorganic material, may have better interface characteristics than when a hole injection layer formed of an organic material is used. Also, compared to a surface of the hole injection layer formed by depositing an organic material, the inorganic semiconductor material has better morphology characteristics. Thus, the improvement of the interface characteristics between the hole injection layer 180 and the second electrode 190, results in a lower driving voltage when driving the OLED display device 200, and a longer life span.

The hole injection layer 180 is formed by the thermal evaporation of an inorganic semiconductor material that evaporates at a temperature of 1100° C., or less. Exemplary thermal evaporation equipment includes a boat or furnace to contain a deposition material, and a hot wire to heat the boat or furnace. The hot wire is durable at 1100° C., or less. Therefore, when the hole injection layer 180 is formed by thermal evaporation, the inorganic semiconductor material evaporates at 1100° C., or less. The inorganic semiconductor material may be, for example, vanadium pentoxide ($V_2O_5$), tungsten oxide ($WO_3$), molybdenum oxide ($MoO_3$), or boron oxide ($B_2O_3$). This process can prevent damage to organic layers, occurring during the formation of a hole injection layer, using sputtering. The process does not need special sputtering equipment, because the process may be performed by the equipment used to deposit the organic layer. Moreover, as compared to a hole injection layer formed by sputtering an inorganic semiconductor material, the hole injection layer 180, formed of the inorganic semiconductor material using the thermal evaporation, may have an improved density and morphology characteristics. As a result, in an inverted structure having an upper anode formed of ITO, IZO, or ZnO disposed on the hole injection layer 180 using sputtering, the damage by sputtering to the organic layer, including the underlying emission layer 150, may be minimized.

In the thermal evaporation, the inorganic semiconductor material may be evaporated from a boat or furnace in a thermal evaporation apparatus, by applying current to the boat or furnace, or by using a furnace for a high temperature cell. Also, the thermal evaporation may be performed in a vacuum, or a nitrogen atmosphere.

The hole injection layer 180 is formed to a thickness of from 5 to 1000 Å. Within this thickness range, the underlying organic layer can be protected from damage during the formation of a second electrode by sputtering. An overall thickness of the OLED display device 200 is thereby not excessively thick, which may be more effective when driving the device 200.

The OLED display device 200 includes second electrode 190 disposed on the hole injection layer 180. The second electrode 190 may be a transparent or reflective electrode. The transparent electrode may be formed of ITO, IZO, or ZnO. The reflective electrode may be formed in a stacked structure, in which a reflective layer is disposed on a transparent electrode material. The reflective layer may be formed of Ag, Al, chromium (Cr), Mo, W, titanium (Ti), tantalum (Ta), or an alloy thereof for example. In this case, the transparent electrode material may be ITO, IZO, or ZnO, for example. Thus, the second electrode 190 (anode) may be completed.

Aspects of the present invention will now be explained, with reference to the following examples, but the scope of the present invention will not be limited thereto.

Example

A cathode was formed by depositing Al, having a thickness of 2000 Å, on a substrate. An electron injection layer was formed by depositing LiF, having a thickness of 5 Å, on the cathode. An electron transport layer was formed by depositing Alq3, having a thickness of 200 Å, on the electron injection layer. TMM004 (available from Merck) was doped with 2 wt % GD33 (available from UDC) and deposited to a thickness of 300 Å on the electron transport layer, thereby forming an emission layer. A hole transport layer was formed by depositing IDE320 (available from Idemitsu) to a thickness of 150 Å, on the emission layer. A hole injection layer was formed by thermally evaporating WO3, having a thickness of 500 Å, on the hole transport layer, in a vacuum. Finally, an anode was formed by depositing ITO, having a thickness of 1000 Å, on the hole injection layer, by sputtering.

The life span of the OLED display device was measured at a brightness of 5000 nit and the current density according to driving voltage of the OLED display device.

Comparative Example

A cathode was formed by depositing Al having a thickness of 2000 Å on a substrate. An electron injection layer was formed by depositing LiF having a thickness of 5 Å on the cathode. An electron transport layer was formed by depositing Alq3 having a thickness of 200 Å on the electron injection layer. TMM004 (available from Merck) was doped with 2 wt % GD33 (available from UDC) to be deposited to a thickness of 300□ on the electron transport layer, thereby forming an emission layer. A hole transport layer was formed by depositing IDE320 (available from Idemitsu) to a thickness of 150 Å on the emission layer. A hole injection layer was formed by thermally evaporating IDE406 (available from Idemitsu) to a thickness of 500 Å on the hole transport layer in a vacuum. Finally, an anode was formed by depositing ITO to a thickness of 1000 Å on the hole injection layer by sputtering.

Figure 2:
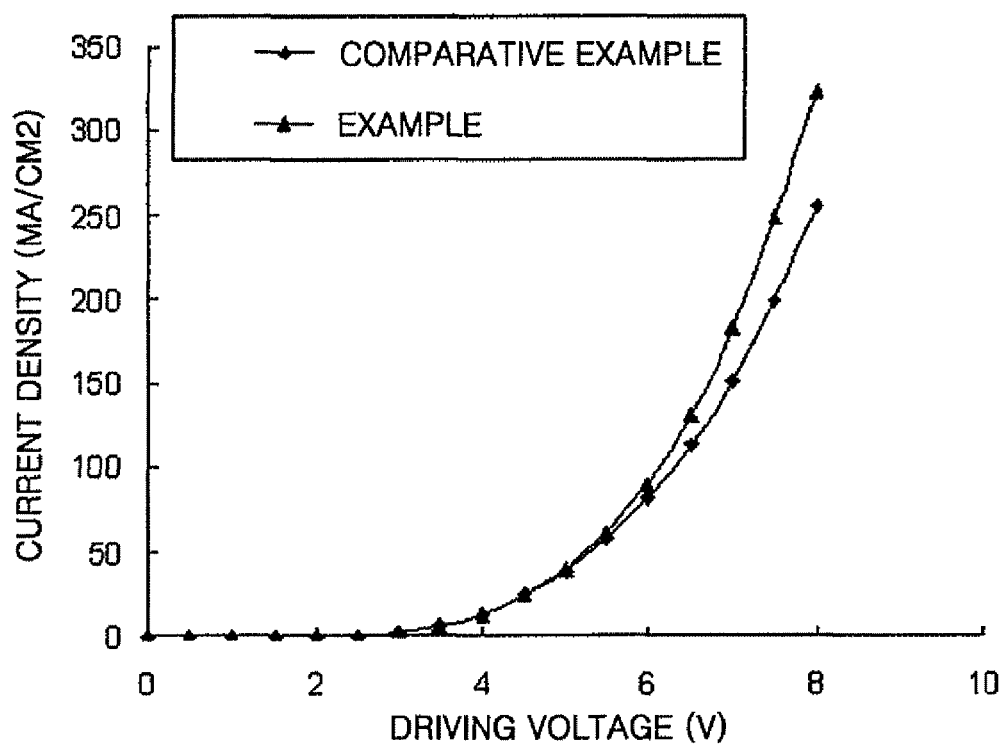
FIG. 2 is a graph illustrating the relationship between driving voltage and current density in an Example and a Comparative Example.

The life span of the OLED display device was measured at a brightness of 5000 nit, and a current density according to driving voltage of the OLED display device. FIG. 2 is a graph illustrating the relationship between driving voltage and current density in an Example and a Comparative Example. The x axis represents driving voltage (V), and the y axis represents current density (mA/cm2).

Referring to FIG. 2, in the Example, when the driving voltages are 6, 7, and 8V, the current densities were approximately 90, 180, and 320 mA/cm2, respectively. However, in the Comparative Example, when the driving voltages are 6, 7, and 8V the current densities were 80, 150, and 250 mA/cm2. It can be seen that the difference between the current densities, in the Example and the Comparative Example, increased with the driving voltage. That is, as the driving voltage increased, the device in the Example had a higher current density than that in the Comparative Example, thereby demonstrating improved driving voltage characteristics. As described above, the Example demonstrated improved interface characteristics with an anode, by forming a hole injection layer of an inorganic material that evaporated at 1100° C., or less, by thermal evaporation, and demonstrated improved driving voltage characteristics as compared to the Comparative Example, in which a hole injection layer was formed of an organic material, by thermal evaporation.

Figure 3:
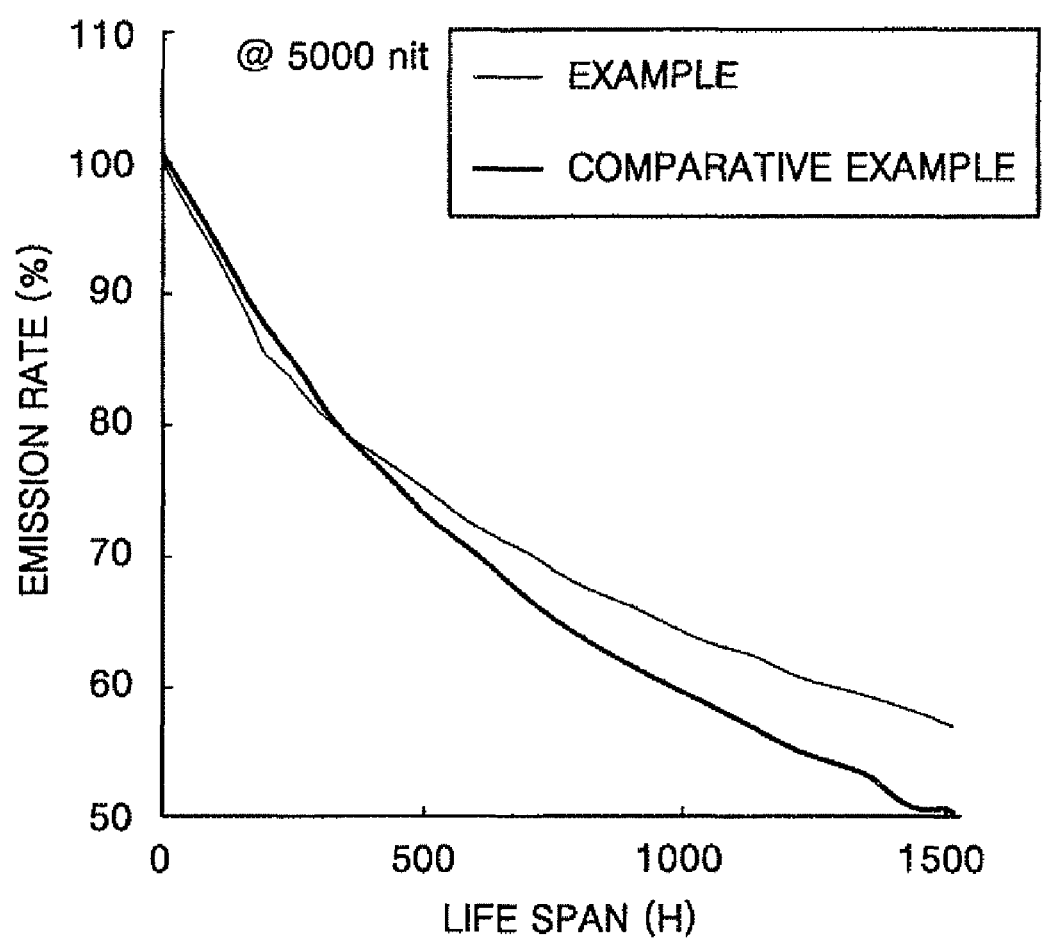
FIG. 3 is a graph illustrating the relationship between the life span and the emission rate in the Example and the Comparative Example.

FIG. 3 is a graph illustrating the relationship between a life span and an emission rate, at a brightness of 5000 nit, in the Example and the Comparative Example. The x axis represents life span (h), and the y axis represents an emission rate (%). Referring to FIG. 3, when driven at a brightness of 5000 nit, in the Example, the emission rate was reduced by 42% after being driven for 1500 hrs, however, in the Comparative Example the emission rate was reduced by 50% after the same driving period. Accordingly, the Example demonstrated improved interface characteristics, by having a hole injection layer formed of an inorganic material that was evaporated at 1100° C., or less, and thus, showed a longer life span than the Comparative Example, in which a hole injection layer was formed of an organic material.

According to aspects of the present invention as described above, a hole injection layer is formed of an inorganic semiconductor material evaporated at a temperature of 1100° C., or less, by thermal evaporation, thereby improving interface characteristics with an anode. Thus, a driving voltage thereof may be reduced, and the life span thereof may be improved. Also, since the inorganic material can also be thermally evaporated using equipment for thermally evaporating an organic material, separate equipment is not required.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device, comprising:
   a substrate;
   a first electrode disposed on the substrate;
   an emission layer disposed on the first electrode;
   a hole injection layer disposed on the emission layer; and
   a second electrode disposed directly on the hole injection layer,
   wherein the hole injection layer comprises an inorganic semiconductor material,
   the hole injection layer is provided between the substrate and the second electrode; and
   the inorganic semiconductor material is boron oxide ($B_2O_3$); and
   the emission layer comprises a host material selected from the group consisting of distyrylarylene (DSA), distyrylbenzene (DSB), a DSB derivative, a 4,4'-bis(2,2'-diphenylvinyl)-1,1'-biphenyl (DPVBi) derivative, spiro-DPVBi, spiro-sixphenyl (spiro-6P), 4,4-N,N-dicarbazole-biphenyl (CBP), a CBP derivative, N,N-dicarbazolyl-3,5-benzene (mCP), a mCP derivative, and a spiro derivative.

2. The OLED display device according to claim 1, wherein the first electrode is a cathode and the second electrode is an anode.

3. The OLED display device according to claim 2, wherein the anode comprises indium tin oxide (ITO), indium zinc oxide (IZO), or zinc oxide (ZnO).

4. The OLED display device according to claim 1, wherein the hole injection layer has a thickness of from 5 to 1000 Å.

5. The OLED display device according to claim 1, further comprising at least one selected from the group consisting of a hole transport layer, a hole blocking layer, an electron blocking layer, an electron transport layer, and an electron injection layer, disposed between the first and second electrodes.

6. The OLED display device according to claim 2, wherein the hole injection layer is disposed between the emission layer and the anode.

7. The OLED display device according to claim 1, wherein the first electrode comprises a reflective material selected from the group consisting of magnesium (Mg), calcium (Ca), aluminum (Al), silver (Ag), barium (Ba), and an alloy thereof.

8. The OLED display device according to claim 1, wherein the emission layer comprises a dopant material selected from the group consisting of styrylamine-based perylene-based, and distyrylbiphenyl-based materials.

9. The OLED display device according to claim 1, wherein the inorganic semiconductor material evaporates at a temperature of 1100° C. or less.

10. An organic light emitting diode (OLED) display device, comprising:
   a cathode disposed on a substrate;
   an emission layer disposed on the cathode;
   a hole injection layer disposed on the emission layer, comprising an inorganic semiconductor material of $B_2O_3$; and
   an anode disposed directly on the hole injection layer,
   wherein the hole injection layer is provided between the substrate and the anode; and
   the emission layer comprises a host material selected from the group consisting of distyrylarylene (DSA), distyrylbenzene (DSB), DSB derivative, a 4,4'-bis(2,2'-diphenylvinyl)-1,1'-biphenyl (DPVBi) derivative, spiro-DPVBi, spiro-sixphenyl (spiro-6P), 4,4-N,N-dicarbazole-biphenyl (CBP), a CBP derivative, N,N-dicarbazolyl-3,5-benzene (mCP), a mCP derivative, and a spiro derivative.

11. The OLED display device according to claim 10, further comprising a substrate disposed on the cathode.

12. The OLED display device according to claim 10, further comprising at least one selected from the group consisting of a hole transport layer, a hole blocking layer, an electron blocking layer, an electron transport layer, and an electron injection layer, disposed between the anode and the cathode.

* * * * *